United States Patent [19]
Pirez

[11] Patent Number: 5,187,395
[45] Date of Patent: Feb. 16, 1993

[54] BIMOS VOLTAGE BIAS WITH LOW TEMPERATURE COEFFICIENT

[75] Inventor: Yolanda M. Pirez, Miami, Fla.

[73] Assignee: Motorola, Inc., Schaumburg, Ill.

[21] Appl. No.: 637,588

[22] Filed: Jan. 4, 1991

[51] Int. Cl.$^5$ .................. G06G 7/10; H03K 17/60
[52] U.S. Cl. .................. 307/491; 307/310; 307/570; 307/296.7
[58] Field of Search ............ 307/491, 310, 570, 296.1, 307/296.6, 296.7; 323/313, 314, 907, 289, 256

[56] References Cited

U.S. PATENT DOCUMENTS

| | | | |
|---|---|---|---|
| 3,452,287 | 6/1969 | Büsch et al. | 330/289 |
| 3,781,648 | 12/1973 | Owens | 323/313 |
| 3,899,693 | 8/1975 | Gaudreault | 307/310 |
| 3,956,661 | 5/1976 | Sakamoto et al. | 323/313 |
| 4,473,762 | 9/1984 | Iwahashi et al. | 307/310 |
| 4,553,048 | 11/1985 | Bynum et al. | 307/310 |
| 4,622,476 | 11/1986 | Venkatesh | 307/310 |
| 4,656,375 | 4/1987 | Lauffer et al. | 307/310 |
| 4,716,315 | 12/1987 | Bell | 307/491 |
| 4,730,228 | 3/1988 | Einzinger et al. | 307/491 |
| 4,780,624 | 10/1988 | Nicollini | 307/296 |
| 4,839,535 | 6/1989 | Miller | 307/296 |
| 4,853,610 | 8/1989 | Schade, Jr. | 323/316 |
| 4,943,737 | 7/1990 | Guo et al. | 307/296.7 |
| 5,034,626 | 7/1991 | Pirez et al. | 307/310 |

FOREIGN PATENT DOCUMENTS

| | | | |
|---|---|---|---|
| 0032362 | 3/1978 | Japan | 323/313 |
| 0080550 | 7/1978 | Japan | 323/313 |
| 0034044 | 3/1979 | Japan | 323/313 |
| 0201415 | 10/1985 | Japan | 323/907 |

OTHER PUBLICATIONS

Tooker, "Accurate Low-Voltage Calibrator", Popular Electronics, vol. 29, No. 3, Sep. 1968, p. 66.

Primary Examiner—William L. Sikes
Assistant Examiner—Toan Tran
Attorney, Agent, or Firm—Juliana Agon

[57] ABSTRACT

A biasing network (2) including a MOS transistor (12) provides a biasing voltage (Vy) to bias a bipolar voltage amplifier (4) having a base emitter voltage ($V_{BE}$) of an opposite temperature coefficient from the biasing network (2). A summing node (17) sums the biasing voltage (Vy) and the base emitter voltage ($V_{BE}$) to provide an overall low temperature coefficient to provide a constant output voltage (Vx) for the amplifier (4) over temperature.

10 Claims, 1 Drawing Sheet

BIMOS VOLTAGE BIAS WITH LOW TEMPERATURE COEFFICIENT

TECHNICAL FIELD

This invention relates generally to a bipolar metal oxide semiconductor (BIMOS) circuit for an amplifier and more specifically to a circuit utilizing a metal oxide semiconductor (MOS) device for generating a low temperature bias voltage for a bipolar amplifier in an integrated device.

BACKGROUND

Any electrical circuit that uses a transistor as an amplifier needs to bias the transistor at some operating point so that the device is in the active region. The current through the device or the voltage applied to the transistor device will determine this operating or bias point. Over temperature, the bias point also needs to be maintained by a stable bias voltage, so that the design characteristics will also remain within the specified design limits. For example, a stable oscillator bias circuit is necessary to provide a constant or regulated oscillator voltage output over temperature.

Conventional biasing circuits employing only bipolar transistors to generate a relatively temperature stable bias voltage for a bipolar amplifier are generally well known in the prior art. Nevertheless, because the voltage of $V_{BE}$ across the base-emitter junction of a bipolar transistor has a negative temperature coefficient, other voltages derived from this voltage inevitably will also have the same negative characteristic. Hence, the output voltage of the amplifier such as in an oscillator or voltage generator will still be varied over temperature. To combat the varying output voltages, more complicated methods such as bandgap voltage reference and zener circuits have been utilized. However, the method utilizing the zener breakdown voltage of a PN junction as a reference is limited in accuracy to its positive temperature coefficient.

A more accurate reference voltage may be achieved by using the bandgap voltage reference circuits to provide a regulated output in a bipolar implementation. However, due to higher density and lower power consumption, MOS is the technology of choice in today's integrated circuits (IC). However, MOS circuits have the inherent problem of being unable to provide a precise control of outputs. In addition, the threshold voltage $V_T$ of a P-MOS transistor, which is the equivalent of $V_{BE}$ in bipolar technology, has a positive temperature coefficient from which to derive voltages. (Likewise, an N-MOS transistor has a negative temperature coefficient.) Accordingly, the output voltage in MOS circuits can change drastically due to temperature or process variations.

It would therefore be desirable to provide a merged or composite bipolar/MOS circuit which combines the advantages of bipolar and MOS technologies together. Hence, bandgap voltage reference circuits have been accomplished using both bipolar and MOS circuits. The major defects of these prior art circuits are that complicated circuits are often required and which in turn require a larger area to implement the circuit in an integrated device.

Therefore, it is a desire to merge or arrange bipolar transistors and MOSFET transistors in a common semiconductor substrate in order to form a simple integrated circuit which can be manufactured at a relatively low cost but yet provides a much improved constant output performance over temperature.

SUMMARY OF THE INVENTION

Accordingly, it is an advantage of the present invention to provide a bipolar/MOS (BIMOS) circuit to generate a bias voltage with a low temperature coefficient.

Briefly, according to the invention, a biasing network including a MOS transistor provides a biasing voltage to bias a bipolar voltage amplifier having a base emitter voltage of an opposite temperature coefficient from the biasing network. A summing node sums the biasing voltage and the base emitter voltage to provide an overall low temperature coefficient to provide a constant output voltage for the amplifier over temperature.

DETAILED DESCRIPTION OF THE PREFERRED EMBODIMENT

Figure 1:
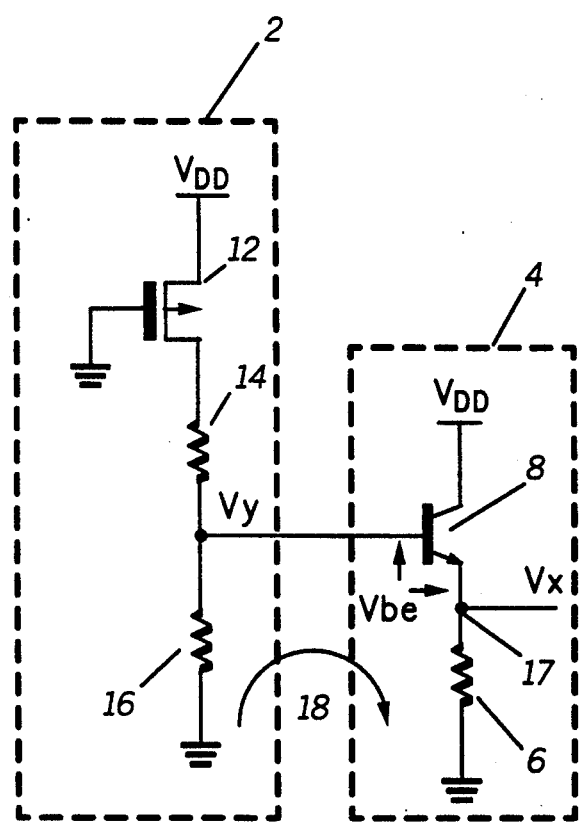
FIG. 1 is a circuit diagram of BIMOS voltage bias circuit according to the present invention.

Referring to FIG. 1, there is shown a schematic circuit diagram of a BIMOS voltage bias circuit with a low temperature coefficient in accordance with the present invention for generating an output voltage $V_x$ which is substantially constant over temperature. A biasing network 2 biases a bipolar amplifier 4 to provide a constant output voltage $V_X$ as determined by an emitter resistor 6 to provide a constant output voltage $V_X$ over temperature.

A PMOS transistor 12 has its source electrode connected to a power supply voltage or potential VDD and the gate connected to a ground potential. The drain of the MOS transistor 12 is connected to a resistor 14 whose other end at $V_Y$ is connected to the base of a bipolar transistor 8 and to another resistor 16 coupled to ground. The collector of the NPN bipolar transistor 8 is also connected to the voltage potential VDD or some other supply. It should be understood to those skilled in the art that the bias network and bipolar amplifier may be formed together as an integrated circuit on a single semi-conductor chip. It is appreciated that the bias network 2, or a functionally equivalent of it (such as one using an NMOS instead of a PMOS transistor), may be used as a biasing circuit to bias any other amplifier (such as one using a PNP transistor) that requires a constant voltage output over temperature.

In operation, the biasing network 2 includes the PMOS transistor 12 connected to the two resistors 14 and 16 to form a voltage divider to bring the base of the bipolar transistor 8 to the proper potential Vy to forward bias the emitter junction. It is known that the PMOS transistor (or MOSFET) 12 has a temperature slope in the positive direction.

On the other hand, the bipolar amplifier 4 includes a NPN transistor 8 having a temperature slope of the opposite direction from the MOS transistor 12. The output node 17 provides an output voltage across the emitter resistor 6 which equals the base voltage $V_Y$ minus the emitter voltage ($V_{BE}$). The summation of these voltages around the circuit loop 18 cancels most of the voltage variation with temperature since the contributions from the MOS and bipolar devices are opposite. For better temperature control, the length and width of the MOS transistor 12 are set, scaled or defined in a manner such that the temperature control, the length and width of the MOS transistor 12 are set, scaled or defined in a manner such that the temperature deviations around the loop 18 cancel out to from an overall low temperature coefficient.

In summary, since the temperature coefficient of the PMOS transistor 12 is positive and the temperature coefficient of the bipolar transistor 8 is negative the voltages derived from these two transistors 12 and 8 are summed or subtracted from each other at the output of the amplifier $V_X$ to cancel or minimize the temperature effect of the bipolar transistor 8. By this configuration a low temperature coefficient of approximately 300 parts per million per degree C for the entire amplifier may be achieved. Other variations of this biasing network may be used to optimize for a temperature stable bias voltage in many applications including for use as in an oscillator inside a communication device such as a mobile or portable radio.

What is claimed is:

1. A BiMOS voltage bias circuit, comprising:
   a biasing network to provide a biasing voltage, said biasing network including a voltage divider and a MOS transistor connected in series, said voltage divider having two resistors and a tapped junction between said two resistors, said MOS transistor having a temperature coefficient and a gate electrode connected to a reference voltage for switching said MOS transistor normally ON;
   a bipolar transistor voltage amplifier having a base-emitter junction voltage having a temperature coefficient that is opposite from that of said MOS transistor of said biasing network,
   said bipolar transistor voltage amplifier having an output node and having its base electrode connected to said tapped junction of said biasing network to receive said biasing voltage, wherein said output node provides a voltage equal to said biasing voltage minus said base-emitter voltage to result in an overall low temperature coefficient for providing a constant output voltage for said amplifier over a predetermined temperature range, and
   first resistive means for providing said constant output voltage, said first resistive means connected to the output node of said bipolar voltage transistor amplifier.

2. The BiMOS voltage bias circuit of claim 1 wherein said MOS transistor is a P-MOS transistor.

3. The BiMOS voltage bias circuit of claim 2 wherein said voltage divider comprises a resistor having a first end and a second end, said first end being connected to a drain electrode of said P-MOS transistor and said second end being connected to said base electrode of said bipolar transistor voltage amplifier at said tapped junction.

4. The BiMOS voltage bias circuit of claim 3 wherein said bipolar transistor voltage amplifier comprises an NPN bipolar transistor.

5. An integrated BiMOS voltage bias circuit with a low temperature coefficient, comprising:
   a substrate;
   a biasing network formed on said substrate to provide a biasing voltage, said biasing network including a voltage divider and a MOS transistor connected in series, said voltage divider having two resistors and a tapped junction between said two resistors, said MOS transistor having a temperature coefficient and a gate electrode connected to a reference voltage for switching said MOS transistor normally ON;
   a bipolar transistor voltage amplifier formed on said substrate, having a base-emitter junction voltage having a temperature coefficient that is opposite from that of said MOS transistor of said biasing network,
   said bipolar transistor voltage amplifier having an output node and having its base electrode connected to said tapped junction of said biasing network to receive said biasing voltage, wherein said output node provides a voltage equal to said biasing voltage minus said base-emitter voltage for providing an overall low temperature coefficient to result in a constant output voltage for said amplifier over a predetermined temperature range, and
   first resistive means for providing said constant output voltage, said first resistive means connected to the output node of said bipolar voltage transistor amplifier.

6. An integrated BiMOS voltage bias amplifier circuit, with a low temperature coefficient, for a radio, comprising:
   a substrate;
   a biasing network formed on said substrate to provide a biasing voltage, said biasing network including a voltage divider and a P-MOS transistor connected in series, said voltage divider having two resistors and a tapped junction between said two resistors, said P-MOS transistor having a temperature coefficient and a gate electrode connected to a ground;
   a bipolar transistor voltage amplifier formed on said substrate, said bipolar transistor voltage amplifier having a base-emitter junction voltage having a temperature coefficient that is opposite from that of said biasing network,
   said bipolar transistor voltage amplifier having an output node at its emitter electrode and having its base electrode connected to said tapped junction of said biasing network to receive said biasing voltage, wherein said output node provides a voltage equal to said biasing voltage minus said base-emitter voltage to result in an overall low temperature coefficient for providing a constant output voltage for said amplifier over a predetermined temperature range, and
   first resistive means for providing said constant output voltage, said first resistive means connected to the emitter electrode of said bipolar transistor voltage amplifier.

7. The BiMOS voltage bias circuit of claim 2 wherein said P-MOS transistor has its source electrode connected to a supply potential; and said two resistors comprising:
   second resistor means for providing impedance, said second resistive means connected at one end to the drain electrode of said P-MOS transistor; and
   third resistive means for providing impedance, said third resistive means connected at one end to an opposite end of said second resistive means and connected at an opposite end to ground.

8. The BiMOS voltage bias circuit of claim 7 wherein said bipolar transistor voltage amplifier has its collector electrode connected to said supply potential or another supply potential and its base electrode connected to said opposite end of said second resistive means.

9. The BiMOS voltage bias circuit of claim 1 wherein said first resistive means is connected at an opposite end to a ground potential.

10. The BiMOS voltage bias circuit of claim 1 wherein said MOS transistor is a P-channel enhancement MOS transistor.

* * * * *